United States Patent
Mizoguchi et al.

(10) Patent No.: US 10,180,459 B2
(45) Date of Patent: Jan. 15, 2019

(54) MONITORING SYSTEM FOR DETECTING OCCURRENCE OF LEAKAGE CURRENT AND/OR RELAY SHORT-CIRCUIT CONDITION IN AN ELECTRICAL SYSTEM

(71) Applicant: DENSO CORPORATION, Kariya, Aichi-pref. (JP)

(72) Inventors: Hayato Mizoguchi, Kariya (JP); Takashi Inamoto, Kariya (JP)

(73) Assignee: DENSO CORPORATION, Kariya (JP)

( * ) Notice: Subject to any disclaimer, the term of this patent is extended or adjusted under 35 U.S.C. 154(b) by 378 days.

(21) Appl. No.: 15/210,077

(22) Filed: Jul. 14, 2016

(65) Prior Publication Data

US 2017/0016959 A1    Jan. 19, 2017

(30) Foreign Application Priority Data

Jul. 14, 2015    (JP) .................. 2015-140598

(51) Int. Cl.
*G01R 31/327* (2006.01)
*H02H 3/04* (2006.01)
*H02H 3/17* (2006.01)
*G01R 31/44* (2006.01)

(52) U.S. Cl.
CPC ......... *G01R 31/3278* (2013.01); *G01R 31/44* (2013.01); *H02H 3/044* (2013.01); *H02H 3/17* (2013.01)

(58) Field of Classification Search
CPC ....... G01R 31/3278; G01R 31/44; H02H 3/17
USPC ....... 324/415, 418, 500, 509–512, 522, 523, 324/527, 541, 544, 555; 340/3.1, 3.22, 340/3.8; 702/1, 57, 64; 219/130.1
See application file for complete search history.

(56) References Cited

U.S. PATENT DOCUMENTS

2015/0060423 A1    3/2015 Tanaka et al.

FOREIGN PATENT DOCUMENTS

JP    3781289 B2    5/2006

*Primary Examiner* — Melissa Koval
*Assistant Examiner* — Courtney McDonnough
(74) *Attorney, Agent, or Firm* — Oliff PLC

(57) ABSTRACT

A monitoring system is applied to an electrical system, which includes a DC power source and an electrical apparatus that is connected to the DC power source by a pair of electric power leads incorporating respective switches. To detect leakage current from the DC power source, a low-frequency AC signal is applied via a large-capacitance capacitor to a specific connection position, between a first terminal of the DC power source and the corresponding switch, and the resultant voltage of that signal is measured. To detect a short-circuit failure of one or both of the switches, a high-frequency AC signal is applied via a low-capacitance capacitor to the specific connection position, and the resultant signal voltage is measured. Judgement as to occurrence of leakage current and/or short-circuit failure is based on the measured signal voltage values.

8 Claims, 13 Drawing Sheets

MONITORING SYSTEM FOR DETECTING OCCURRENCE OF LEAKAGE CURRENT AND/OR RELAY SHORT-CIRCUIT CONDITION IN AN ELECTRICAL SYSTEM

CROSS-REFERENCE TO RELATED APPLICATIONS

This application is based on and incorporates herein by reference Japanese Patent Application No. 2015-140598 filed on Jul. 14 2015.

BACKGROUND OF THE INVENTION

Field of Application

The present invention relates to a monitoring system for detecting leakage current of a DC power source and/or a short-circuit failure of relays in an electrical system supplying power from the DC power source to an electrical apparatus.

Description of Related Technology

A monitoring system for detecting leakage current in a DC power source is known, as described in Japanese patent No. 3781289 (designated in the following as reference 1). A pair of electric power leads are connected to the DC power source, and power is supplied through the electric power leads to an electrical apparatus. a relay is installed in the electric power leads, controlled for connecting/disconnecting the DC power source to/from the electrical apparatus. A signal generator section which generates an AC signal and a measurement section which measures a voltage value of the AC signal are coupled to one of the electric power leads, at a position between the DC power source and the relay of that electric power lead. When a leakage current flows in the DC power source, the AC signal flows to ground, so that the value of the AC signal voltage measured by the measurement section becomes lowered. With such a monitoring system, when the measured AC signal voltage falls below a predetermined value, it is judged that leakage current is flowing from the DC power source.

The relay contains switches, which may experience a short-circuit failure. For example the switch contacts may become welded together, or a drive circuit of the relay may become defective, so that the switch may remain held in the on state even if it is attempted to be set to the off state. It is proposed to use the above-described AC signal to perform monitoring for detecting such a short-circuit failure. The background of that proposal is as follows. The switches are respectively connected in the pair of electric power leads. In the prior art, to perform monitoring to detect short-circuit failure of such a switch, a first one of the switches (and only that switch) is controlled to be set in the on state. If at that time the other switch (second one of the two switches) has a short-circuit failure, a current will flow through a capacitor that is connected in parallel with the electrical apparatus, so that the measured AC voltage value will increase. Hence, by judging whether or not the capacitor voltage rises, a decision can be made as to whether the second switch has a short-circuit failure. If it is judged that the second switch does not have a short-circuit failure, then next, the second switch(and only that switch) is controlled to be set in the on state. If at that time the first switch has a short-circuit failure, then a current will flow through the capacitor, so that the measured AC voltage value will increase. Hence, by judging whether or not the capacitor voltage rises, a decision can be made as to whether the first switch has a short-circuit failure.

In the prior art, to perform such switch short-circuit failure monitoring, it is necessary to operate the pair of switches respectively separately. However if only a single electromagnetic coil is used, the pair of switches cannot be operated respectively separately, but can only be operated to the on and off states concurrently. Hence, it is necessary for the relays to employ two electromagnetic coils, for operating the switches to the on and off states. As a result, the problem arises that the manufacturing cost of such a relay becomes increased. Hence there is a requirement for avoiding such an increase in manufacturing cost, by using only single electromagnetic coil.

Thus it has been envisaged that the above-described AC signal might be used to monitor for switch short-circuit failure, even in the case of relays in which the respective switches cannot be operated separately.

That is to say, a low value of resistance could be established between ground and respective positions on each electric power lead between the corresponding switch and the electrical apparatus. In that case if there is a short-circuit failure of a switch, the AC signal produced by the signal generating section would flow through the switch and pass via the corresponding electric power lead to the electrical apparatus, and would flow to ground from the electric power lead via the low resistance. By monitoring the level of the AC signal, a decision could be made as to whether a switch has a short-circuit failure, i.e., based on whether or not the AC signal voltage has decreased from a normal level. In that way, short-circuit failure monitoring could be performed without executing on/off operation of the switches, i.e., with both switches set to the off state. Thus, it could be envisaged that such a method would be applicable even in the case of a relay in which the two switches cannot be operated respectively separately.

However if such a method were attempted, it would be difficult to judge whether short-circuit failure of a switch has actually occurred. That is, since it is necessary to sufficiently insulate each electric power lead from ground, the resistance value between the electric power lead and ground must be substantially high. Thus even if there is a short-circuit failure of a switch, the level of current which flows to ground must be small, so that the measured voltage of the AC signal will not fall substantially.

SUMMARY OF THE INVENTION

Hence it is desired to overcome the above problem, by providing a monitoring system whereby AC signals can be utilized to for leakage current detection and short-circuit detection, and which is applicable to a power supply system in which the two relays cannot be operated respectively separately.

Specifically, the monitoring system is applicable to an electrical system which includes a DC power source, first and second electric power leads which connect respective first and second terminals of the DC power source to an electrical apparatus, first and second switches, respectively incorporated in the first and second electric power leads, and an electrically conducting member, insulated from the electric power leads and connected to a ground potential.

To achieve the above objective, the monitoring system comprises at least two capacitors respectively connected between an electrically conducting member and each of the first and second electric power leads, a signal generating section, a voltage measurement section, and a judgement section. The electrically conducting member is connected to ground potential.

The signal generating section generates an AC signal which is applied to a position in a specific circuit section of the electrical system. The specific circuit section consists of the DC power source, the part of the first electric power lead located between a first terminal of the DC power source and the first switch, and the part of the second electric power lead located between the second terminal of the DC power source and the second switch. The voltage measurement section is electrically coupled to the specific circuit section, and measures the voltage of the AC signal. The judgement section judges, based on measurement results obtained by the voltage measurement section, whether a leakage current is flowing from the DC power source and whether at least one of the first and second switches is in a short-circuit failure condition.

Such a short-circuit failure generally results from welding of the contacts of a switch, causing the switch to be held permanently in an on (i.e., closed) condition, unable to be operated between the on and off states.

In particular with the present invention, the signal generating section generates the AC signal at a relatively low frequency when the judgement section is judging whether a leakage current is flowing from the DC power source, and generates the AC signal at a higher frequency than the low-frequency AC signal when the judgement section is judging whether at least one of the switches is in a short-circuit failure condition.

The frequency of the high-frequency AC signal is sufficiently high that the capacitors present a relatively low value of impedance to that signal, while the frequency of the low-frequency AC signal is sufficiently low that the capacitors present a relatively high value of impedance to that signal. As a result, during short-circuit failure monitoring of the switches (with both of the switches operated to the off state), if there is short-circuit failure of either or both of the switches, the high-frequency AC signal passes via the short-circuited switch(es) and the capacitors to ground. The measured value of the high-frequency AC signal thereby decreases substantially from a normal value, so that occurrence of the short-circuit failure can be judged.

During leakage current monitoring, if there is current leakage from the DC power source (i.e., excessively low resistance between the terminals of the DC power source and ground), the measured value of the low-frequency AC signal thereby decreases substantially from a normal value. Occurrence of leakage current from the DC power source can thereby be judged.

Furthermore if the leakage current monitoring is executed when there is no leakage current from the DC power source, but either or both of the switches is in a short-circuit failure condition, there is little danger that the short-circuit failure will result in error in the monitoring. This is due to the high impedance that is presented to the low-frequency AC signal by the capacitors disposed between the electric power leads and the electrically conducting member The low impedance ensures that the level of the low-frequency AC signal will not decrease significantly from a normal level when there is not a leakage current.

Hence, the invention enables short-circuit failure monitoring of the switches and leakage current monitoring to be respectively executed, by employing respectively different values of AC signal frequency, and is applicable to a relay having a pair of switches which cannot be operated respectively separately.

DESCRIPTION OF PREFERRED EMBODIMENTS

Figure 1:
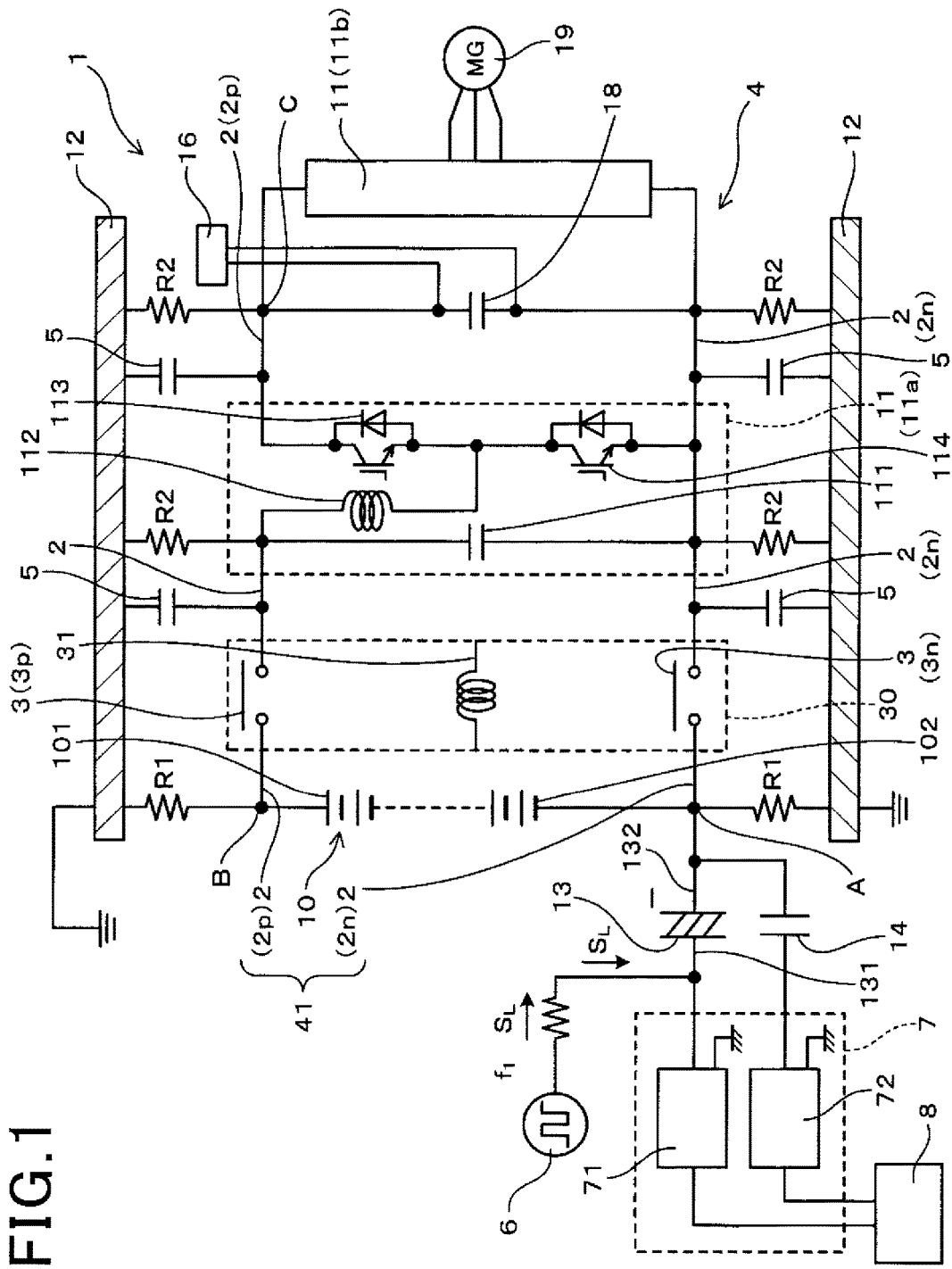
FIG. 1 is a circuit diagram of a first embodiment of a monitoring system, during leakage current monitoring operation, for a case in which there is no short-circuit failure of a switch and there is no flow of leakage current.

Each of the following embodiments of a monitoring system is a vehicle-mounted system, installed in an electric vehicle or hybrid vehicle, etc.

First Embodiment

A first embodiment of monitoring system will be described referring to FIGS. 1 to 11. An electrical system 1 is controlled to supply electric power from a DC power source 10 to a 3-phase AC motor-generator 19 when the 3-phase AC motor-generator 19 is operated as a motor, and to supply electric power from the 3-phase AC motor-generator 19 to charge the DC power source 10 during a regeneration mode of operation of the 3-phase AC motor-generator 19.

The monitoring system consists of capacitors 5, a signal generating section 6, a voltage measurement section 7, and a judgement section 8. The capacitors 5 are connected to an electrically conducting member 12, as described in the following.

The electrical system 1 includes a main circuit section 4, having the DC power source 10, a pair of electric power leads 2p, 2n, and a pair of switches 3p, 3n within a relay 30. The electric power leads 2p, 2n are connected between the DC power source 10 and an electrical apparatus 11, and the switches 3p, 3n are respectively connected in the electric power leads 2p, 2n.

The electrical apparatus 11 consists of a voltage step-up apparatus 11a and a power inverter 11b. The electric power lead 2p includes a first section which is connected between the positive terminal 101 of the DC power source 10 and the switch 3p, and a second section connected between the switch 3 and the voltage step-up apparatus 11a. The switch 3n is connected between the negative terminal 102 of the DC power source 10 and the power inverter 11b.

The electrically conducting member 12 is insulated from the electric power leads 2p, 2n and is connected to ground potential. The capacitors 5 are respectively connected between the electrically conducting member 12 and those parts of the electric power leads 2p, 2n on the opposite side from the switches 3p, 3n (i.e., which are connected on the side of the electrical apparatus 11).

The DC power source 10, the part of the electric power lead 2p connected between the switch 3p and the positive terminal 101 of the DC power source 10, and the part of the electric power lead 2n connected between the switch 3n and the negative terminal 102 of the DC power source 10 are collectively referred to as the main circuit No. 1 section 41 in the following.

The signal generating section 6 is controlled to selectively generate a high-frequency AC signal $S_L$ and a low-frequency AC signal $S_L$, which are transferred via a leakage current detection-use capacitor 13 to the part of the main circuit No. 1 section 41 that is connected to the negative terminal 102 of the DC power source 10. The judgement section 8 judges whether the DC power source 10 has a leakage current, and whether there is a short-circuit failure condition of at least one of the switches 3p, 3n.

Control of the signal generating section 6, voltage measurement section 7, and judgement section 8 of the monitoring circuit section, during monitoring operation, is performed by a processor (not shown in the drawings) which executes a program stored in memory beforehand.

When monitoring is being performed to judge whether there is a leakage current from the DC power source 10, the signal generating section 6 is controlled to generate the low-frequency AC signal $S_L$, having a relatively low frequency. When monitoring is being performed to judge whether there is a short-circuit failure of a switches 3p, 3n, the signal generating section 6 is controlled to generate the high-frequency AC signal $S_H$, having a higher frequency than the low-frequency AC signal $S_L$ (see FIG. 7).

This embodiment is installed in an electric vehicle or hybrid vehicle, which is assumed to have an electrically conductive body, and the electrically conducting member 12 is constituted by the body of the vehicle, which is connected to the ground potential of the electrical systems of the vehicle.

During operation of the 3-phase AC motor-generator 19 as a motor, with this embodiment, the voltage step-up apparatus 11a performs voltage step-up of the output voltage from the DC power source 10 and the power inverter 11b converts the stepped-up DC power from the voltage step-up apparatus 11a to AC power, which is applied to drive the 3-phase AC motor-generator 19.

The voltage step-up apparatus 11a includes a filter capacitor 111, a reactor 112, diodes 113 and switch elements 114.

The switch elements 114 execute switching operations, in conjunction with the reactor 112, for performing voltage step-up of the output from the DC power source 10.

A smoothing capacitor 18 is connected between the electric power lead 2n and the third section of the electric power lead 2p (i.e., is connected across the output from the voltage step-up apparatus 11a), and a charging apparatus 16 is connected in parallel with the smoothing capacitor 18. Before the switches 3p, 3n are set to the on (i.e., closed) state, the smoothing capacitor 18 is charged by using the charging apparatus 16. As a result, a surge of current is prevented when the switches 3p, 3n become set to the on state.

Figure 11:
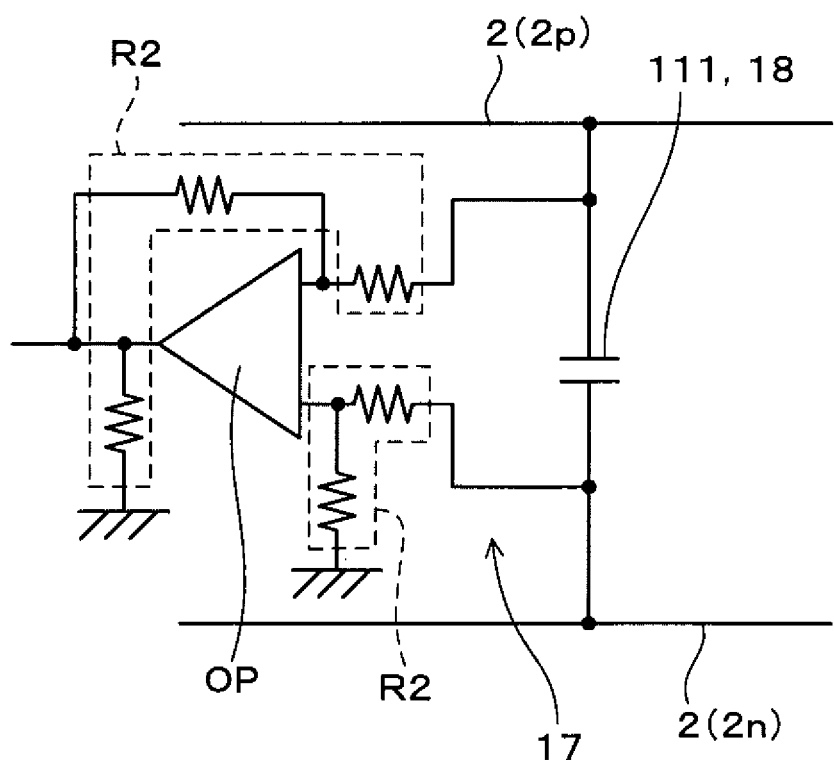
FIG. 11 is a circuit diagram of a voltage measurement circuit for a smoothing capacitor, in the first embodiment.

In FIG. 1, R1 denotes the resistance of air or an insulating material between the DC power source 10 and the electrically conducting member 12. This resistance can have a value of several hundreds of MΩ, for example (i.e., in a normal condition, without significant leakage current from the DC power source 10). Resistors R2 are connected between the filter capacitor 111 and the electrically conducting member 12. Each of respective pairs of the resistors R2 shown in FIG. 1 is constituted by a voltage measurement circuit 17 consisting of an operational amplifier and a plurality of resistors, as shown in FIG. 11. The value of a resistor R2 is for example several MΩ.

The capacitors 5, connected between the electrically conducting member 12 and those parts of the electric power leads 2p, 2n on the opposite side from the switches 3p, 3n, serve to pass electrical noise (generated by the electrical apparatus 11) to ground.

The switches 3p, 3n in the relay 30 are actuated in common by a single electromagnetic coil 31 of the relay 30. When a current is passed through the electromagnetic coil 31, both of the switches 3p, 3n are operated to the on state.

Further as shown in FIG. 1, the signal generating section 6 and the voltage measurement section 7 are coupled to the electric power lead 2n via capacitors 13 and 14. Peak voltage values of the AC signals generated by the signal generating section 6 are measured by the voltage measurement section 7, which consists of a leakage current detection-use measurement section 71 and a short-circuit detection-use measurement section 72. The leakage current detection-use measurement section 71 measures the peak value Vp of the low-frequency AC signal $S_L$ and the short-circuit detection-use measurement section 72 measures the peak value Vp of the high-frequency AC signal $S_H$.

The leakage current detection-use capacitor 13 is an electrolytic capacitor. The short-circuit detection-use capacitor 14 is a non-polarity type of capacitor, i.e., whose terminal voltage can be reversed without danger of damage to the capacitor, and which with this embodiment is a ceramic capacitor.

Figure 4:
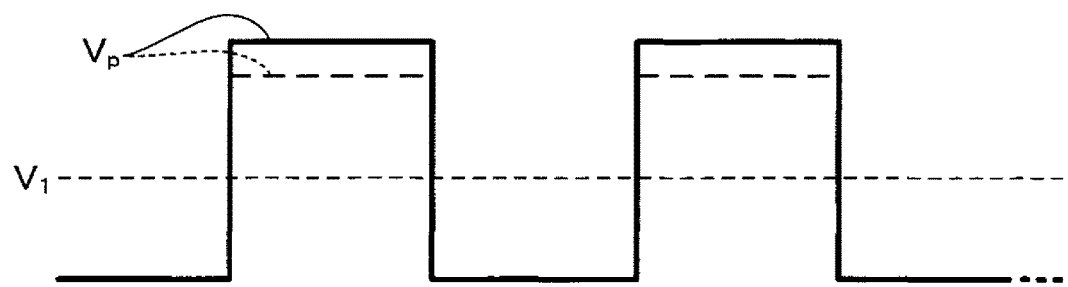
FIG. 4 is a waveform diagram of a low-frequency AC signal of the first embodiment, for a case in which is not a flow of leakage current.

The signal generating section 6 is connected between the leakage current detection-use capacitor 13 and the leakage current detection-use measurement section 71. While leakage current monitoring of the DC power source 10 is being performed, the low-frequency AC signal $S_L$ is generated by the signal generating section 6. If there is no leakage current from the DC power source 10, only a substantially low value of the low-frequency AC signal $S_L$ can pass through the resistors R1I. In that case as shown in FIG. 4, the value of peak voltage Vp that is measured by the leakage current detection-use measurement section 71 will be comparatively high, exceeding the No. 1 threshold value V1.

Figure 2:
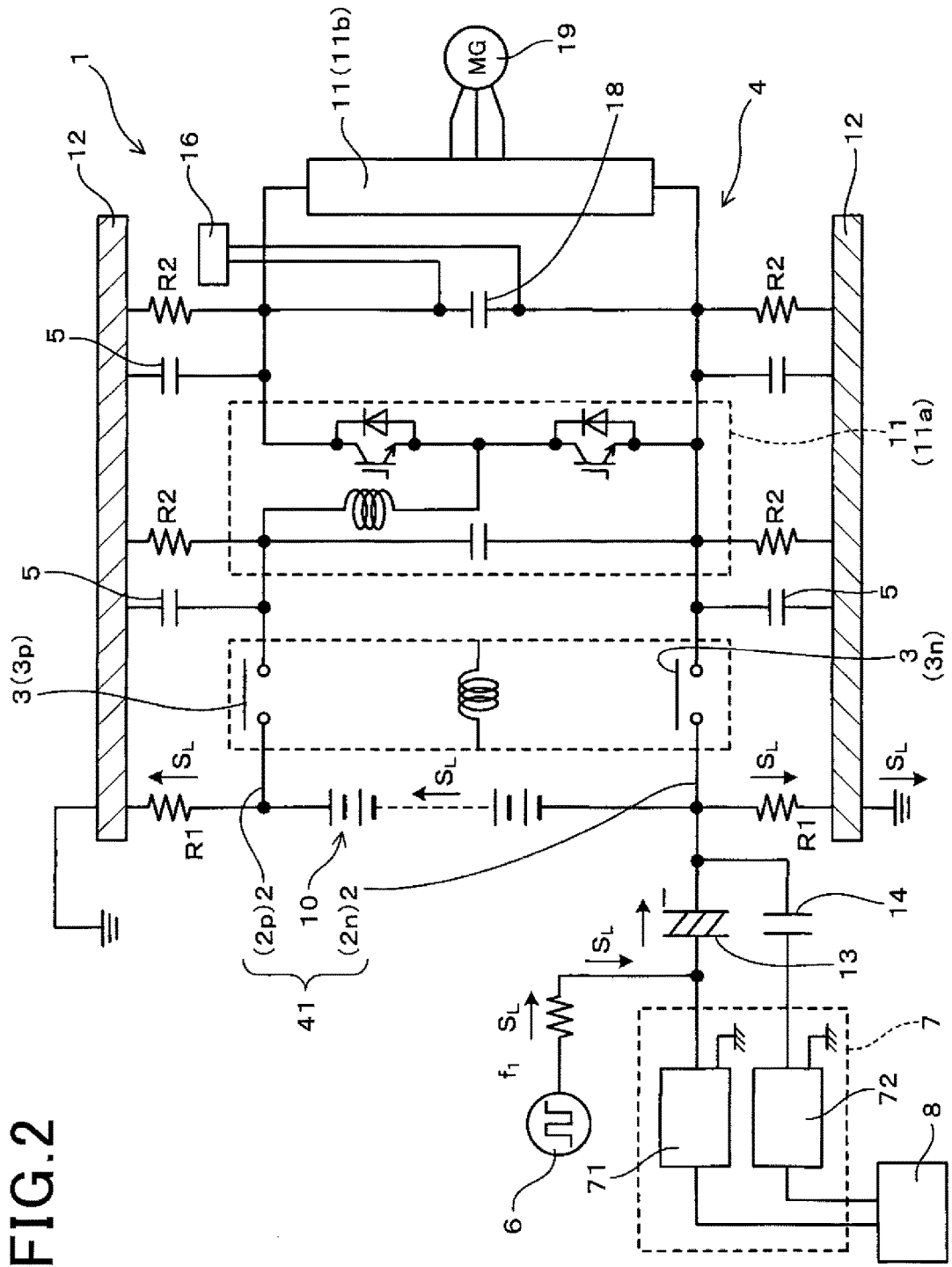
FIG. 2 is a circuit diagram of the first embodiment, during leakage current monitoring operation, for a case in which there is no short-circuit failure of a switch and there is a flow of leakage current.
Figure 5:
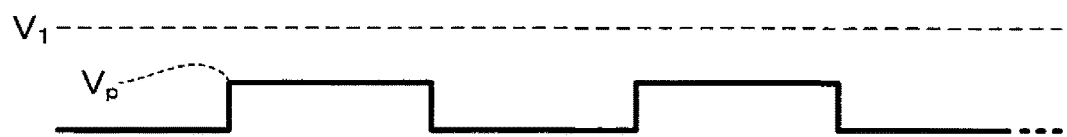
FIG. 5 is a waveform diagram of the low-frequency AC signal of the first embodiment, for a case in which is a flow of leakage current.

However if a leakage current flows from the DC power source 10 (that is, the resistors R1 attain an excessively low value), the low-frequency AC signal $S_L$ will flow through the leakage current detection-use capacitor 13 and the resistors R1 to the electrically conducting member 12, i.e., to ground, as shown in FIG. 2. In that case as shown in FIG. 5, the value of peak voltage Vp that is measured by the leakage current detection-use measurement section 71 will be decreased, falling below the No. 1 threshold value V1. When this occurs, the judgement section 8 judges that there is a leakage current from the DC power source 10.

Figure 3:
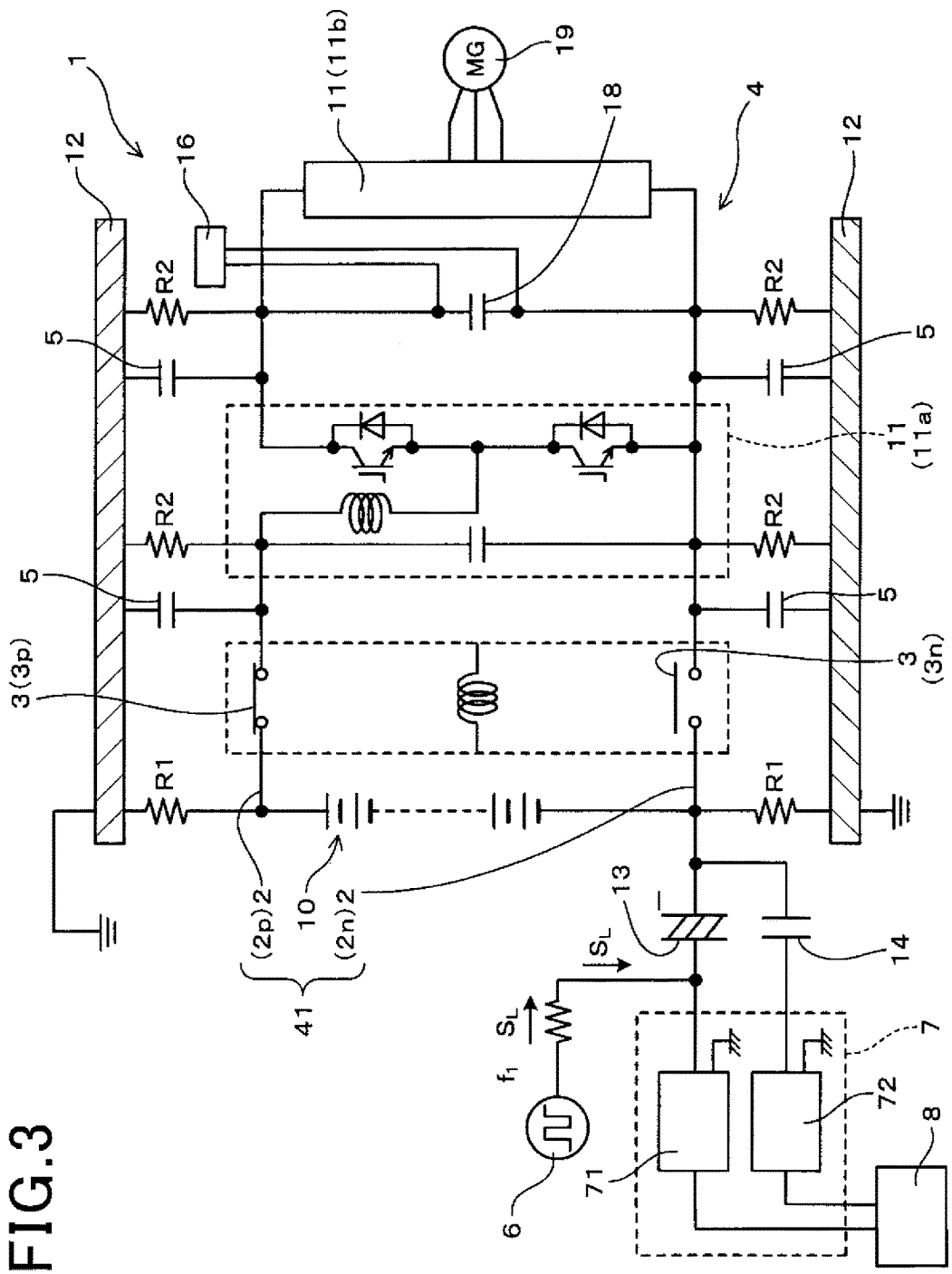
FIG. 3 is a circuit diagram of the first embodiment, during leakage current monitoring operation, for a case in which there is short-circuit failure of a switch and there is not a flow of leakage current.

It is possible that one or both of the switches 3p, 3n may by in a short-circuit failure condition while leakage current monitoring is being performed. This is illustrated by the example of FIG. 3, in which there is a short-circuit failure of the switches 3p, 3n. In that case, since the impedance of the capacitors 5 to the low-frequency AC signal $S_L$ is high, almost none of the low-frequency AC signal $S_L$ flows through the capacitors 5. As a result, as illustrated by the upper broken-line portion in FIG. 4, (if there is no leakage current from the DC power source 10 at that time) the peak voltage Vp of the low-frequency AC signal $S_L$ will decrease by only a small amount, and will remain above the No. 1 threshold value V1.

With the example of FIG. 3, only the switch 3p is in a short-circuit failure condition. However similarly, if the switch 3n alone has a short-circuit failure, or if both of the pair of switches 3p and 3n have short-circuit failures (and there is no leakage current from the DC power source 10), the peak voltage Vp will decrease by only a small amount, and remain above the No. 1 threshold value V1, when leakage current monitoring is performed.

Figure 6:
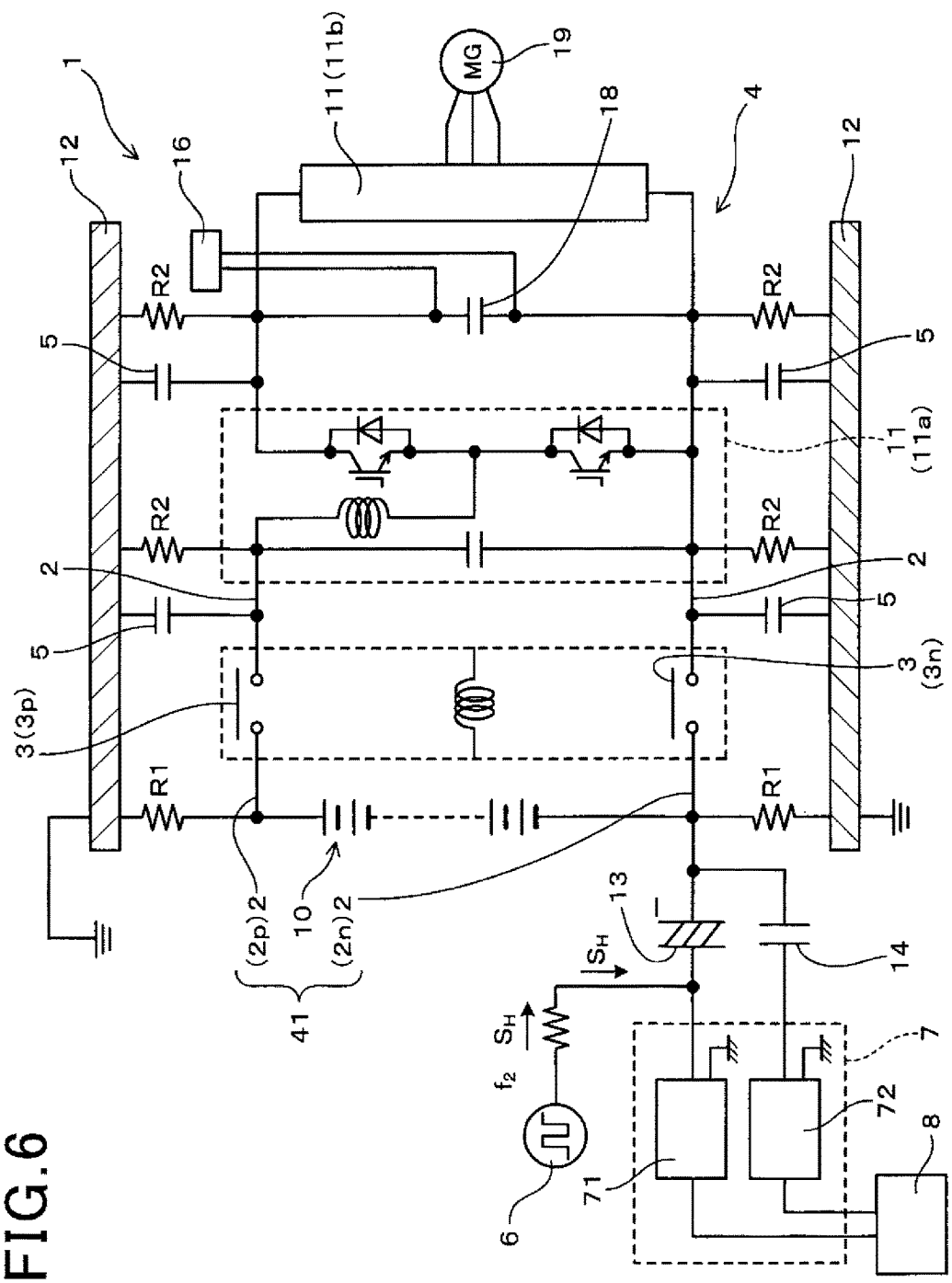
FIG. 6 is a circuit diagram of the first embodiment, during short-circuit monitoring operation, for a case in which there is no short-circuit failure of a switch and there is not a flow of leakage current.
Figure 8:
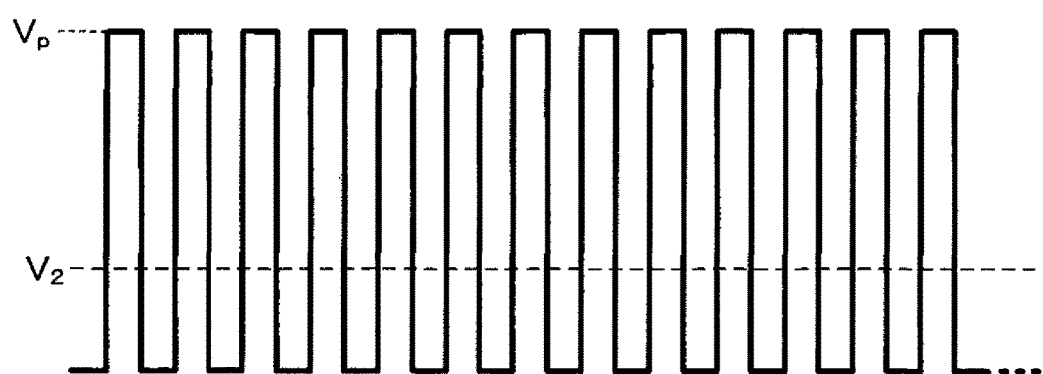
FIG. 8 is a waveform diagram of a high-frequency AC signal of the first embodiment, for a case in which there is no short-circuit failure of a switch.

If it is judged that there is no leakage current from the DC power source 10, short-circuit failure monitoring of the pair of switches 3p and 3n is performed. In this case, the signal generating section 6 generates the high-frequency AC signal $S_H$ as described above. If there is no short-circuit failure of either of the pair of switches 3p and 3n, as illustrated in FIG. 6, the high-frequency AC signal $S_H$ cannot pass through either of these switches. Hence as illustrated in FIG. 8, the peak voltage Vp of the high-frequency AC signal $S_H$, as measured by the short-circuit detection-use measurement section 72, will have a comparatively high value, exceeding the No. 2 threshold value V2.

Figure 7:
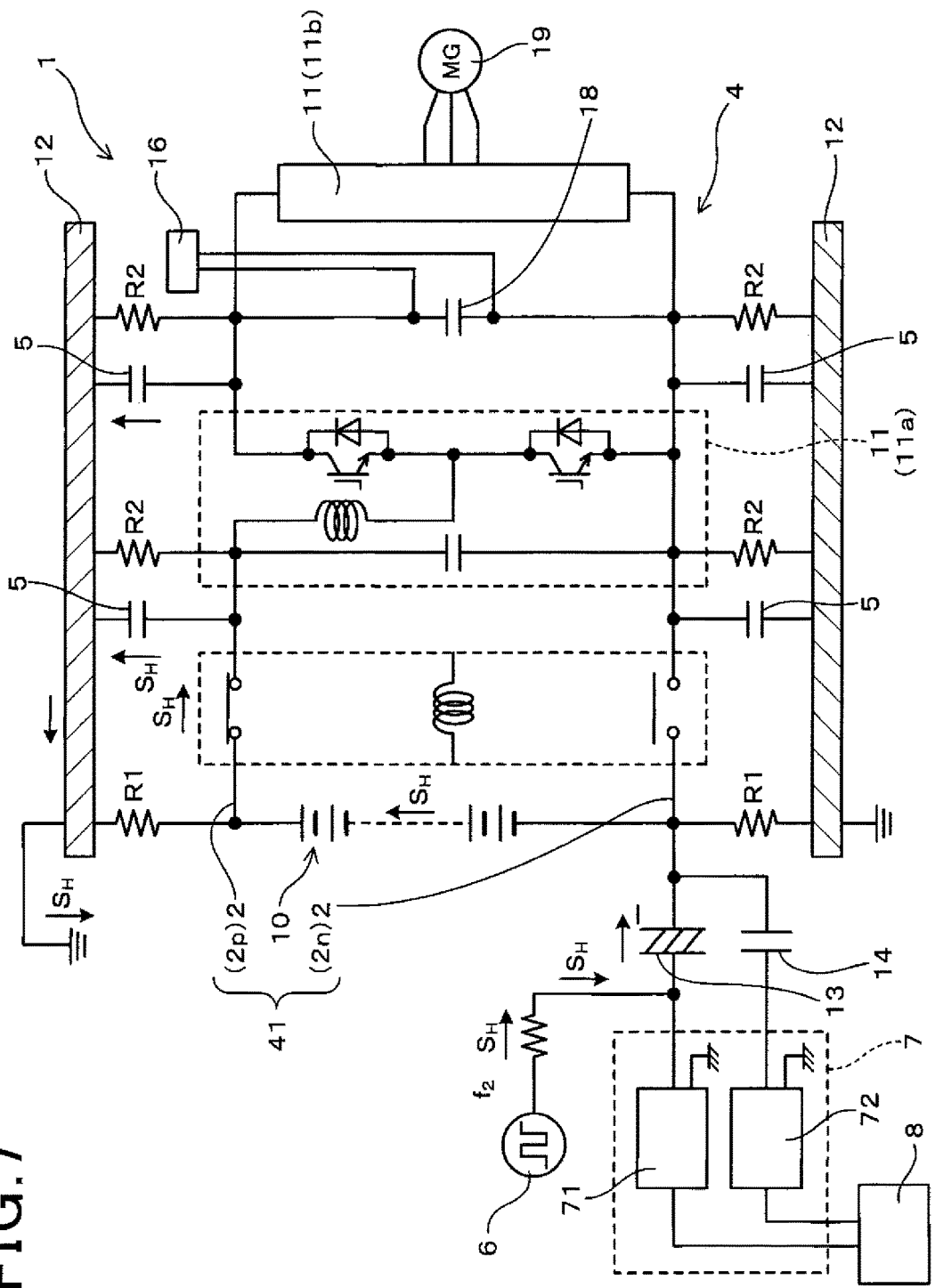
FIG. 7 is a circuit diagram of the first embodiment, during short-circuit monitoring operation, for a case in which there is short-circuit failure of a switch and there is not a flow of leakage current.
Figure 9:
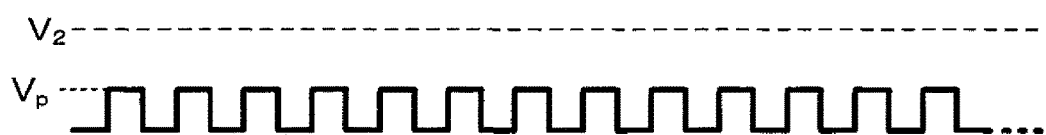
FIG. 9 is a waveform diagram of a high-frequency AC signal of the first embodiment, for a case in which is there is a short-circuit failure of a switch.

Further, as shown in FIG. 7, if there is a short-circuit failure of the switch 3p, the high-frequency AC signal $S_H$ will flow to ground, passing through the switch 3p and the capacitors 5 to the electrically conducting member 12. This occurs since the capacitors 5 have only a low impedance with respect to the high-frequency AC signal $S_H$. Hence in this case as shown in FIG. 9, the peak voltage Vp of the high-frequency AC signal $S_H$, as measured by the short-circuit detection-use measurement section 72, will fall below the No. 2 threshold value V2. With the example of FIG. 7, only the switches 3p, 3n is in a short-circuit failure condition. Similarly if the switch 3n alone has a short-circuit failure, or if both of the pair of switches 3p and 3n have short-circuit failures, the peak voltage Vp of the high-frequency AC signal $S_H$ will fall below the No. 2 threshold value V2. When this occurs, the judgement section 8 judges that there is a short-circuit failure of at least one of the pair of switches 3p and 3n.

Figure 10:
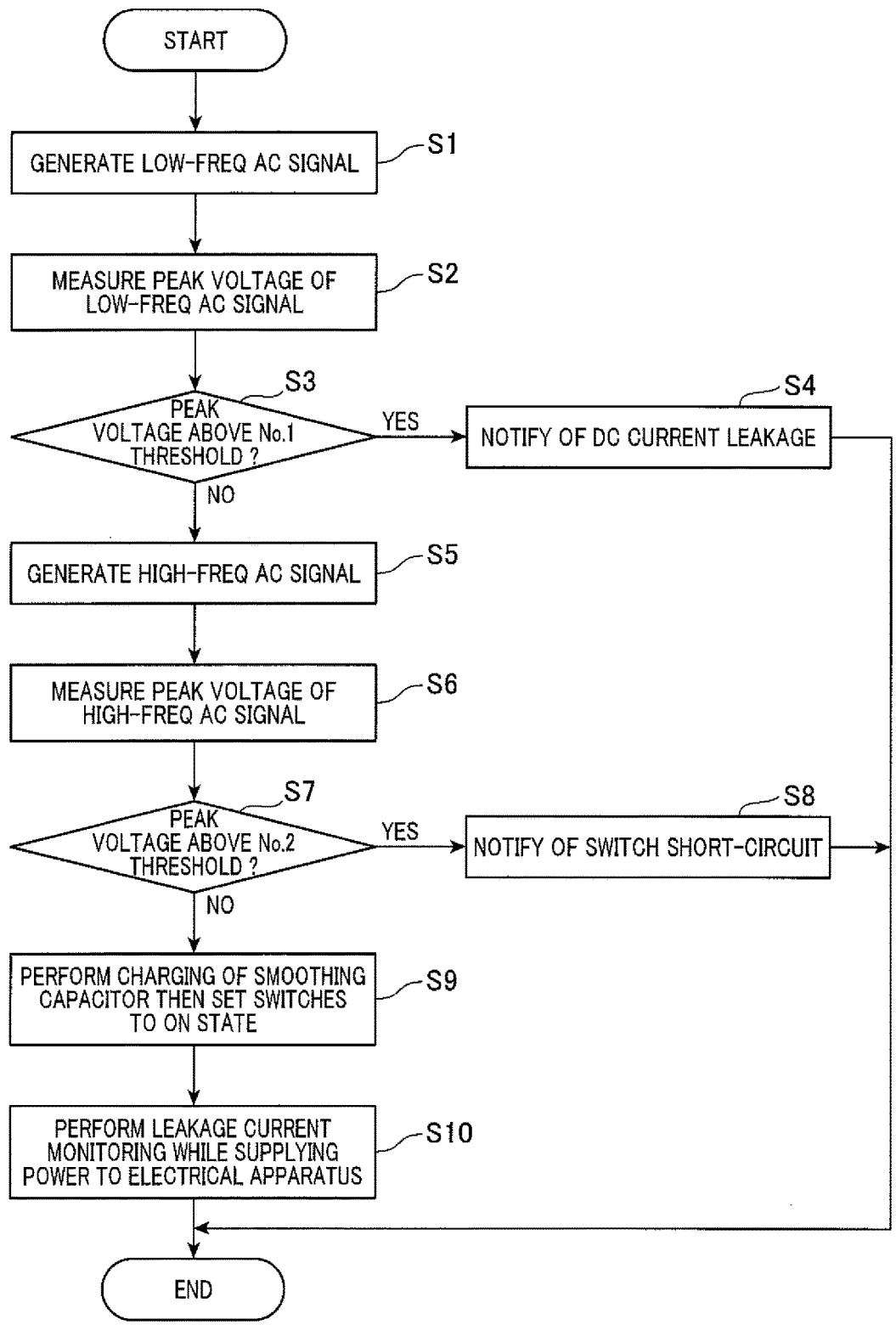
FIG. 10 is a flow diagram of operation of the monitoring system of the first embodiment.

FIG. 10 is a flow diagram of the operation of the monitoring system. With this embodiment, the low-frequency AC signal $S_L$ is first generated by the signal generating section 6 (step S1). The peak voltage of the signal $S_L$ is then measured (step S2). A decision is then made (step S3) as to whether the peak voltage is above the No. 1 threshold value V1 as shown in FIG. 5. If there is a YES decision, step S4 is then executed, to notify the user that there is leakage current from the DC power source 10. If there is a NO decision in step S3, step S5 is then executed, in which the signal generating section 6 generates the high-frequency AC signal $S_H$.

Next in step S6, the peak voltage Vp of the signal $S_H$ is measured, and step S7 is then executed. In step S7, a decision is made as to whether Vp is above the No. 2 threshold value V2. If there is a YES decision, step S8 is then executed, to notify the user that there is short-circuit failure of at least one of the pair of switches 3p and 3n. If there is a NO decision in step S7, step S9 is then executed, in which charging of the smoothing capacitor 18 is performed using the charging apparatus 16 (see FIG. 1), and both of the pair of switches 3p and 3n are then set to the on state, in a condition in which no surge current will flow. Step S10 is then executed, in which DC power is supplied from the DC power source 10 to the electrical apparatus 11, with leakage current monitoring being again performed. That is to say, the low-frequency AC signal $S_L$ is again generated by the signal generating section 6 and the peak voltage Vp of the signal $S_L$ is measured by the leakage current detection-use measurement section 71. If Vp is found to be below the No. 1 threshold value V1, it is judged by the judgement section 8 that there is leakage current from the DC power source 10. In that case, supplying of power from the DC power source 10 to the electrical apparatus 11 is halted.

The effects obtained by this embodiment will be described in the following.

With the embodiment, capacitors 5 are provided between the electrically conducting member 12 and the parts of the electric power leads 2p, 2n that connect the switches 3p, 3n to the electrical apparatus 11. During leakage current monitoring of the DC power source 10, the low-frequency AC signal $S_L$ is generated, and when short-circuit failure monitoring of the switches 3p, 3n is being performed, the high-frequency AC signal $S_H$ is generated. During the short-circuit failure monitoring, the capacitors 5 have a low impedance to the high-frequency AC signal $S_H$. Hence as shown in FIG. 7, if there is a short-circuit of either of the switches 3p, 3n, the high-frequency AC signal $S_H$ will be passed by the switch (or switches) concerned, through the capacitors 5 to ground (i.e., to the electrically conducting member 12). Hence as shown in FIG. 9, the value of the high-frequency AC signal $S_H$ that is measured by the voltage measurement section 7 will greatly decrease. It can thereby be judged that there is a short-circuit failure of a switch 3p and/or 3n, if the peak voltage Vp of the high-frequency AC signal $S_H$ falls below the threshold value V2.

When performing leakage current monitoring of the DC power source 10, with the low-frequency AC signal $S_L$ being generated, if there is a leakage current from the DC power source 10 (the condition illustrated in FIG. 2), the signal $S_L$ will flow to ground. Hence as shown in FIG. 5, the value of the low-frequency AC signal $S_L$ that is measured by the voltage measurement section 7 will greatly decrease. It can thereby be judged that there is a leakage current from the DC power source 10, if the peak voltage Vp of the signal $S_L$ falls below the threshold value V1.

As a result of using both the high-frequency AC signal $S_H$ and low-frequency AC signal $S_L$, leakage current monitoring and short-circuit failure monitoring can be respectively performed irrespective of whether or not there is currently a short-circuit failure of either of the switches 3p, 3n. Specifically, if the low-frequency AC signal $S_L$ alone were to be utilized for both the short-circuit failure monitoring and the leakage current monitoring, then during the short-circuit failure monitoring, the low-frequency AC signal $S_L$ would not flow to ground through the capacitors 5, so that it would be impossible to judge whether there is a short-circuit failure of a switch 3p and/or 3n. Such a problem is avoided with the above embodiment, by using the low-frequency AC signal $S_L$ during leakage current monitoring and using the high-frequency AC signal $S_H$ during short-circuit failure monitoring. During the short-circuit failure monitoring, if there is a short-circuit failure of a switch 3p and/or 3n, the high-frequency AC signal $S_H$ will flow through the switch(es) concerned to ground. During the leakage current monitoring, since the low-frequency AC signal $S_L$ cannot be passed by (is substantially blocked by) the capacitors 5, the leakage current monitoring will be unaffected irrespective of whether or not there is a short-circuit failure of a switch 3p and/or 3n, i.e., the short-circuit failure condition will not result in significant error in judging whether there is a leakage current.

Furthermore as shown in FIG. 1, a short-circuit detection-use capacitor 14 is connected between the leakage current detection-use measurement section 71 and the main circuit No. 1 section 41, and a leakage current detection-use capacitor 13 (having a higher capacitance value than the short-circuit detection-use capacitor 14) is connected between the short-circuit detection-use measurement section 72 and the main circuit No. 1 section 41. The capacitance value of the leakage current detection-use capacitor 13 is made sufficiently high to enable the low-frequency AC signal $S_L$ to be passed through that capacitor, and through the resistors R1 to ground, during leakage current monitoring. If there is a leakage current (i.e., the resistance value of the resistors R1 is excessively low), the value of the low-frequency AC signal $S_L$ becomes lowered, so that occurrence of leakage current can be readily judged.

Figure 15:
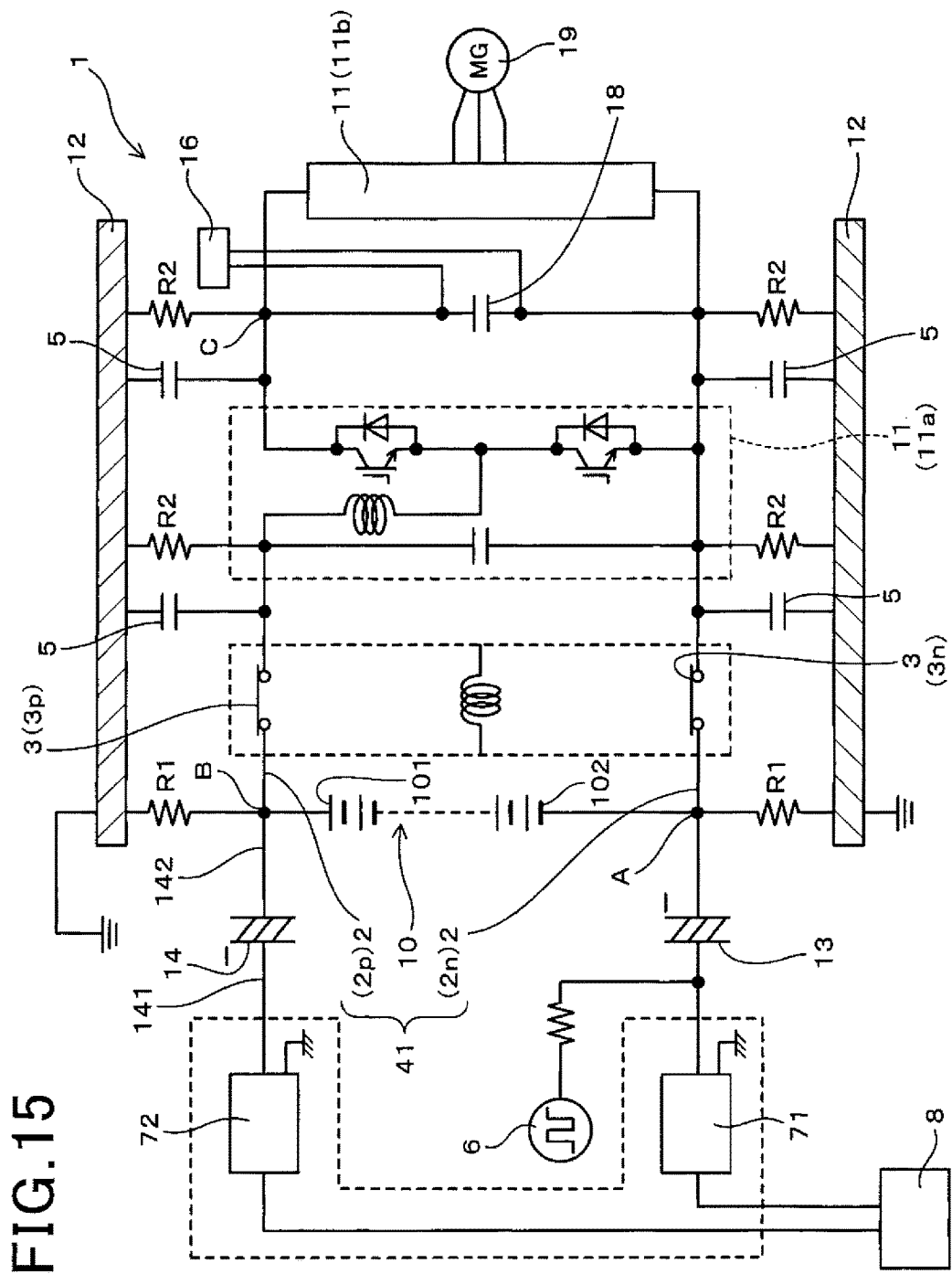
FIG. 15 is a circuit diagram of a reference example of a monitoring system.

Moreover with the above embodiment, the short-circuit detection-use capacitor 14 is a non-polarity type of capacitor. Hence the short-circuit detection-use capacitor 14 can be connected to any position in the main circuit No. 1 section 41, thereby increasing freedom of design. If for example an electrolytic capacitor were to be used as the short-circuit detection-use capacitor 14, as in the reference example of FIG. 15, connected to the electric power lead 2p, the voltage applied to the short-circuit detection-use capacitor 14 could become reversed, thereby causing danger of deterioration of the short-circuit detection-use capacitor 14. That is to say, of the terminals 141 and 142 of the DC power source 10, the potential of the terminal 141 (i.e., the terminal at the opposite side from point B in FIG. 15) is closest to ground potential. The potential of point B is generally higher than ground potential. The terminal 141 is the negative terminal of the DC power source 10 (to which the electrolytic capacitor 13 is connected). With the condition shown in FIG. 15, the voltage of the DC power source 10 may be for example 200 V. (i.e., with the terminals 141 and 142 at potentials of 100 V and −100 V respectively) during non-regeneration operation (i.e., motor drive operation of the 3-phase AC motor-generator 19). Hence in that condition, a normal polarity voltage is applied to the short-circuit detection-use capacitor 14. During regeneration operation of the 3-phase AC motor-generator 19, a higher voltage, e.g., 600 V, may be applied to the DC power source 10. In that condition, a leakage current may flow between the connection point C and the electrically conducting member 12, so that the potential of the connection point C becomes 0 V. Since at that time the 3-phase AC motor-generator 19 is generating an output of 600 V, the potential of the connection point A will become lower than that of the connection point C by 600 V, i.e., will become −600 V. Furthermore since the potential of the connection point B is higher than that of point A by 200 V, the potential of the connection point B will become −400 V. Thus, a reverse-polarity voltage would be applied to the short-circuit detection-use capacitor 14. Hence if an electrolytic capacitor were to be used as the short-circuit detection-use capacitor 14, the capacitor might become damaged.

Figure 12:
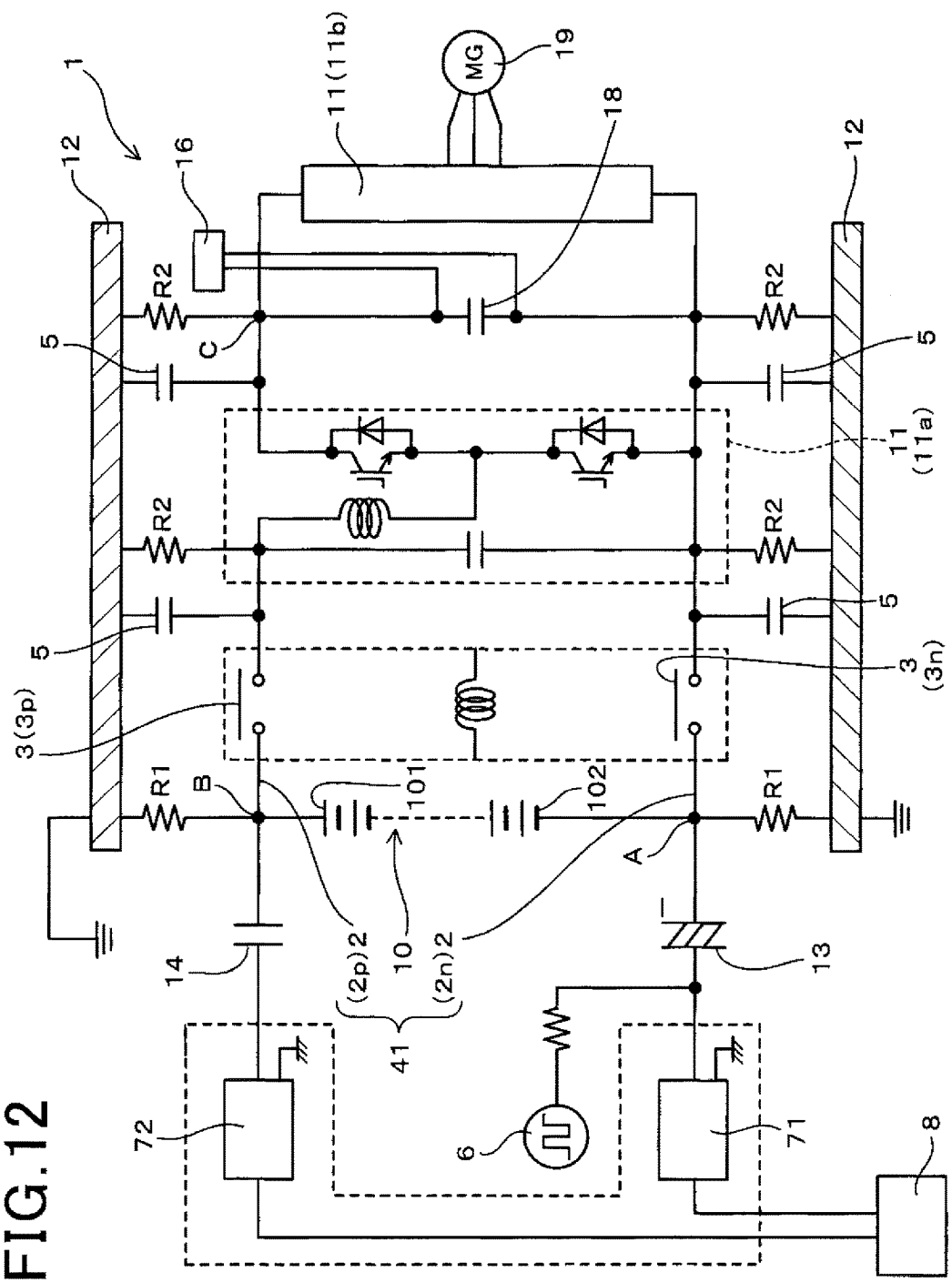
FIG. 12 is a circuit diagram of a second embodiment of a monitoring system.
Figure 14:
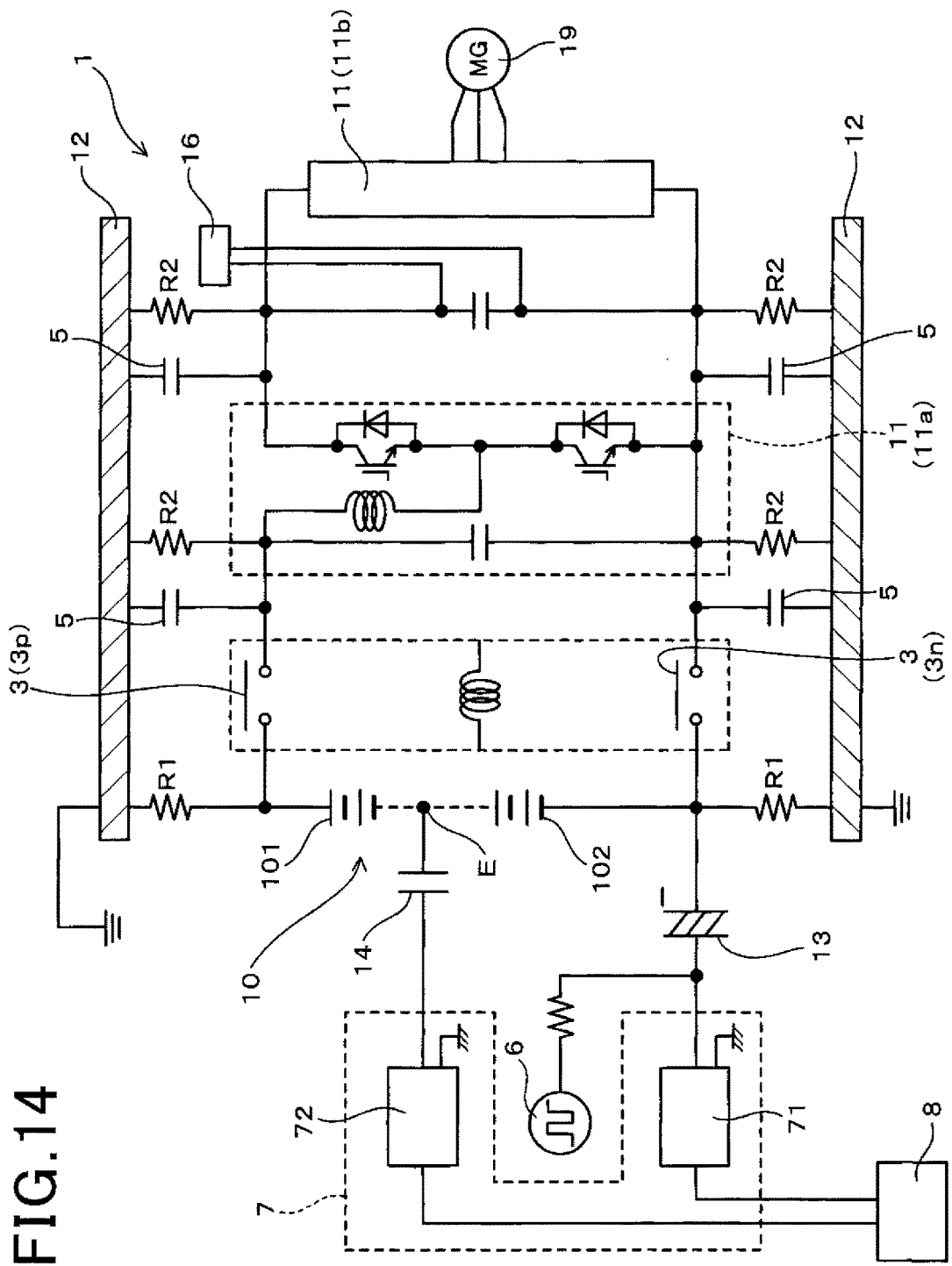
FIG. 14 is a circuit diagram of a fourth embodiment of a monitoring system.

However with the above embodiment, in which the short-circuit detection-use capacitor 14 is a non-polarity type of capacitor, it can safely be connected to positions at which the voltage may become reversed in polarity. Hence, enhanced freedom of design is achieved. The high-frequency AC signal $S_H$ is used when performing short-circuit failure monitoring. Thus even if the short-circuit detection-use capacitor 14 has a small capacitance value, it presents only a low impedance to that signal. A ceramic capacitor or film capacitor may be used as the short-circuit detection-use capacitor 14, and may be connected to any arbitrary position in the main circuit No. 1 section 41. For example as shown in FIG. 12, the short-circuit detection-use capacitor 14 may be connected to the electric power lead 2p, in the main circuit No. 1 section 41. Alternatively as shown in FIG. 14, the short-circuit detection-use capacitor 14 may be connected to the connection point A within the DC power source 10 (i.e., connected to an electrode of the DC power source 10 at a position intermediate between the electrodes 101 and 102 of the DC power source 10).

Furthermore with the above embodiment as shown in FIG. 1, both the leakage current detection-use capacitor 13 and the short-circuit detection-use capacitor 14 are connected in the main circuit No. 1 section 41 at a position that is at the potential of the negative electrode 102 of the DC power source 10. Since both of these capacitors are connected to the same position, design of the monitoring system can be simplified. With the above embodiment, the leakage current detection-use capacitor 13 is an electrolytic capacitor, which is connected to a position (connection point A) which is at the same potential as the negative electrode 102 of the DC power source 10. Thus the polarity of the potential applied to the leakage current detection-use capacitor 13 cannot become reversed. Specifically, of the terminals 131 and 132 (see FIG. 1) of the leakage current detection-use capacitor 13, the terminal 131 (at the opposite side from the connection point A) is close to ground potential. The potential of the connection point A is lower than ground potential, i.e., the potential of the terminal 131 is negative with respect to that of the terminal 132. For example during motor operation of the 3-phase AC motor-generator 19, the potential at the connection point A becomes −100 V as described above, so that the polarity of the voltage applied to the leakage current detection-use capacitor 13 is normal. During regeneration operation of the 3-phase AC motor-generator 19, the potential of the connection point A may fall to −600V. In that case too, the polarity of the voltage applied to the leakage current detection-use capacitor 13 remains normal, so that there is little danger of deterioration of the leakage current detection-use capacitor 13. An electrolytic capacitor can therefore be safely connected to the connection point A.

With the above embodiment, the voltage measurement section measures the peak voltage Vp of the high-frequency AC signal $S_H$ and of the low-frequency AC signal $S_L$. However it would be equally possible to measure the average values of the signals $S_H$ and $S_L$.

With the above embodiment, the capacitors 5 consist of discrete components which are connected between the electric power leads 2p, 2n and the electrically conducting member 12. However it would be equally possible for the function of the capacitors 5 to be performed by stray capacitances. Specifically, by making the spacing between the electric power leads 2p, 2n and the electrically conducting member 12 sufficiently narrow, a sufficiently high value of stray capacitance could be obtained, to serve as the capacitors 5.

Second Embodiment

A second embodiment will be described, using the same reference numerals as for the FIG. 1. Unless otherwise indicated, the constituents of the second embodiment are the same as of the first embodiment.

As for the first embodiment, the short-circuit detection-use capacitor 14 of this embodiment is a ceramic capacitor. With the second embodiment as shown in FIG. 12, the short-circuit detection-use capacitor 14 is changed to a position in the main circuit No. 1 section 41 which is at the potential of the positive terminal 101 of the DC power source 10. Similar effects to those of the first embodiment can be obtained.

Third Embodiment

Figure 13:
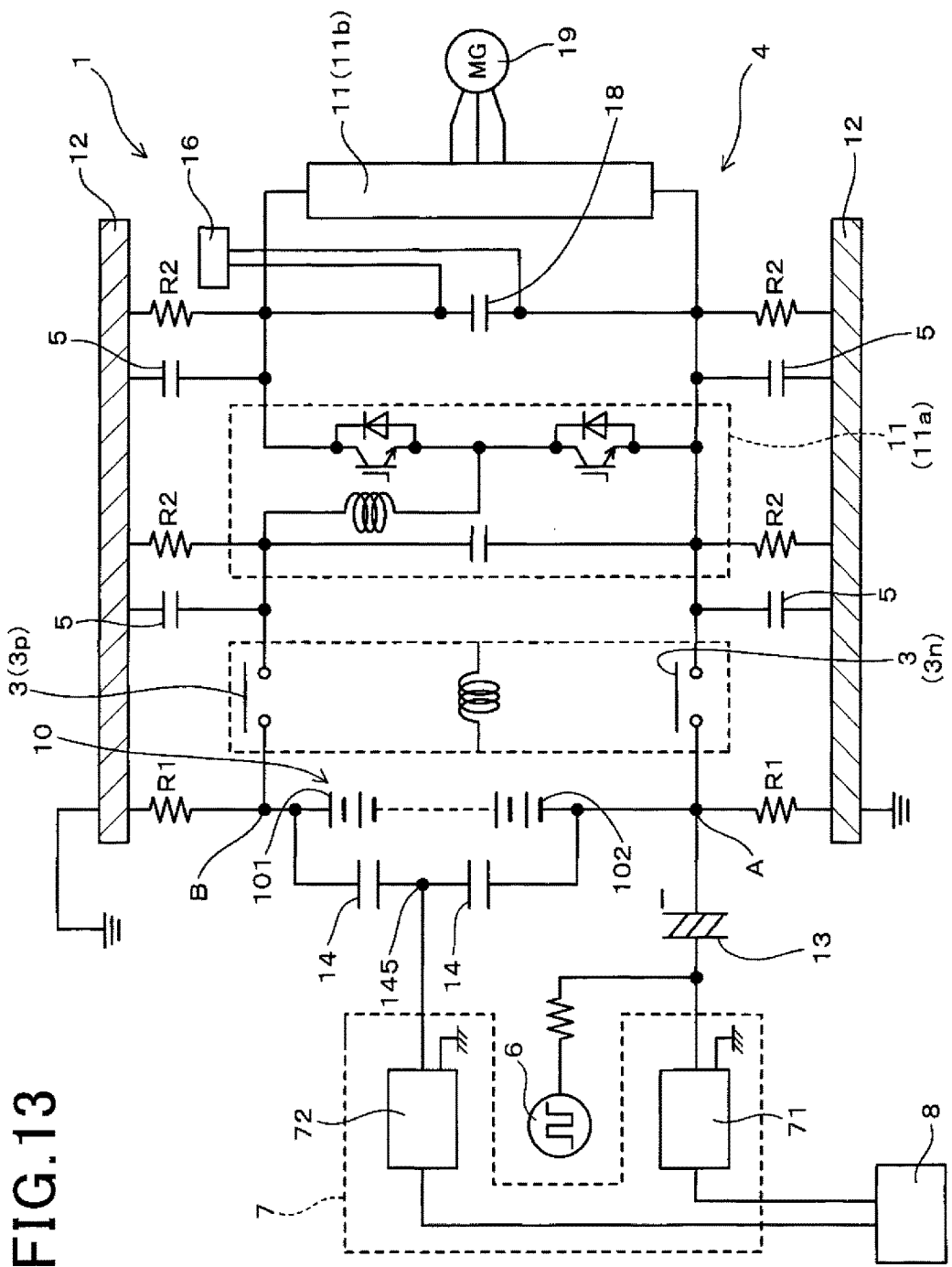
FIG. 13 is a circuit diagram of a third embodiment of a monitoring system.

A third embodiment is a modification of the circuit configuration of the monitoring system of the first embodiment. With the third embodiment as shown in FIG. 13, two capacitors 14a, 14b are connected in series between the terminals 101 and 102 of the DC power source 10, and the voltage measurement section 7 is connected to the junction point 145 of the capacitors 14a, 14b.

Such a configuration ensures a reduced amount of variation in the potential that is measured by the short-circuit detection-use measurement section 72 at the junction point 145, by comparison with the connection point A of the first embodiment. There is thus a reduced possibility that an excessive level of electrical noise will be measured by the short-circuit detection-use measurement section 72. Specifically, when the short-circuit detection-use capacitor 14 is connected to the connection point A (position at the same potential as the negative terminal 102 of the DC power source 10), or is connected to a position at the same potential as the positive terminal 101 of the DC power source 10, as with the second embodiment (see FIG. 12), the following may occur. If there is a short-circuit failure of the switches 3p, 3n, the terminals of the smoothing capacitor 18 and the connection points A, B will go to the same potential. Hence if the charging apparatus 16 performs charging of the smoothing capacitor 18 (thereby causing the potentials of the terminals of the smoothing capacitor 18 to fluctuate) while there is a short-circuit failure of the switches 3p, 3n, the potential between the connection points A, B will vary. Hence an AC current will flow through the short-circuit detection-use capacitor 14 and may be measured (as noise) by the short-circuit detection-use measurement section 72. In that case the short-circuit detection-use measurement section 72 may not be capable of reliably measuring the voltage of the high-frequency AC signal $S_H$. However with the third embodiment, the short-circuit detection-use measurement section 72 is connected to the junction point 145, intermediate between the connection points A and B. As a result, even if charging of the smoothing capacitor 18 is performed while there is a short-circuit failure of the switches 3p, 3n, the potential at the junction point 145 will not vary. Measurement of such variations as a high level of noise, by the short-circuit detection-use measurement section 72, is thereby prevented.

Fourth Embodiment

With a fourth embodiment, as shown in FIG. 14 and described above, the short-circuit detection-use capacitor 14 is connected to an electrode at an intermediate position within the DC power source 10 (i.e., intermediate between the electrodes 101, 102), indicated as connection point E in FIG. 14. In other respects, this embodiment has a similar configuration and provides the same effects as for the third embodiment.

Although the invention has been described with respect to specific embodiments, the scope of the invention is not limited to these, and various modifications or alternative embodiments may be envisaged.

In particular, the invention is not limited in application to a vehicle-installed apparatus, in which the body of the vehicle serves the function of the electrically conducting member 12, to which the capacitors 5 are connected (or which serves to form the capacitors 5 as stray capacitances). It is only necessary that the capacitors 5 be connected between each of the electric power leads 2p, 2n (at positions on the opposite side of the corresponding switches 3p, 3n from the DC power source) and a conductor which is at ground potential.

What is claimed is:

1. A monitoring system for application to an electrical system,
the electrical system comprising
a DC power source, first and second electric power leads which connect respective first and second terminals of the DC power source to an electrical apparatus and first and second switches respectively incorporated in the first and second electric power leads;
the monitoring system comprising
a signal generating section which is controlled to generate an AC signal and is electrically coupled to a specific circuit section of the electrical system, the specific circuit section comprising the DC power source and portions of the first and second electric power leads disposed between the first and second switches and first and second terminals respectively of the DC power source,
a voltage measurement section electrically coupled to the specific circuit section, for measuring a voltage of the AC signal, and
a judgement section configured for judging, based on measurement results obtained by the voltage measurement section, whether a leakage current is flowing from the DC power source and whether at least one of the first and second switches is in a short-circuit failure condition;
wherein the monitoring system comprises an electrically conducting member which is at a ground potential and is insulated from the electric power leads, and comprises at least two capacitors connected between the electrically conducting member and respective ones of the first and second electric power leads, at respective positions on an opposite side of each of the first and second electric power leads from the first and second switches;
and wherein when the judgement section is judging whether a leakage current is flowing from the DC power source, the signal generating section generates the AC signal as a low-frequency AC signal having a relatively low frequency, while when the judgement section is judging whether at least one of the first and second switches is in a short-circuit failure condition and, the signal generating section generates the AC signal at a higher frequency than the low-frequency AC signal.

2. The monitoring system according to claim 1, wherein the voltage measurement section comprises a leakage current detection-use measurement section which measuries a voltage of the low-frequency AC signal and a short-circuit detection-use measurement section which measures a voltage of the high-frequency AC signal, and wherein the monitoring system comprises
a leakage current detection-use capacitor, connected between the leakage current detection-use measurement section and a specific position in the specific circuit section of the electrical apparatus, and
a short-circuit detection-use capacitor, connected between the short-circuit detection-use measurement section and the specific position in the specific circuit section of the electrical apparatus;
the leakage current detection-use capacitor having a higher capacitance value than the short-circuit detection-use capacitor.

3. The monitoring system according to claim 2, wherein the short-circuit detection-use capacitor is a non-polarity type of capacitor, permitting reversal of polarity of a voltage applied between terminals thereof.

4. The monitoring system according to claim 2, wherein the leakage current detection-use capacitor is an electrolytic capacitor.

5. The monitoring system according to claim 2, wherein the specific position in the specific circuit section of the electrical apparatus is predetermined as being a position at which a reversal in polarity of potential does not occur during operation of the electrical system.

6. The monitoring system according to claim 5, wherein the specific position in the specific circuit section of the electrical apparatus is at an identical potential to that of a negative terminal of the DC power source.

7. The monitoring system according to claim 2, wherein the short-circuit detection-use capacitor comprises a pair of capacitors connected in series between a positive terminal and a negative terminal of the DC power source, and wherein the short-circuit detection-use measurement section is connected to a junction point between the pair of capacitors.

8. The monitoring system according to claim 1, wherein the capacitors connected between the electrically conducting members and the first and second electric power leads are constituted by stray capacitances.

* * * * *